(12) United States Patent
Saldana et al.

(10) Patent No.: US 8,328,980 B2
(45) Date of Patent: Dec. 11, 2012

(54) APPARATUS AND METHODS FOR ENHANCED FLUID DELIVERY ON BEVEL ETCH APPLICATIONS

(75) Inventors: Miguel A. Saldana, Fremont, CA (US); Greg Sexton, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 582 days.

(21) Appl. No.: 12/554,871

(22) Filed: Sep. 4, 2009

(65) Prior Publication Data

US 2011/0059614 A1   Mar. 10, 2011

(51) Int. Cl.
*H01L 21/306* (2006.01)

(52) U.S. Cl. ................................. 156/345.29

(58) Field of Classification Search .............. 156/345.29
See application file for complete search history.

(56) References Cited

U.S. PATENT DOCUMENTS

| | | | |
|---|---|---|---|
| 6,800,139 B1 | 10/2004 | Shinriki et al. | 118/715 |
| 7,662,232 B2 | 2/2010 | Kobayashi et al. | 118/715 |
| 2007/0251917 A1 | 11/2007 | Bera et al. | 216/58 |
| 2009/0084758 A1 | 4/2009 | Chen et al. | 216/67 |
| 2009/0188627 A1 | 7/2009 | Fang et al. | 156/345.43 |
| 2011/0059614 A1* | 3/2011 | Saldana et al. | 438/706 |

FOREIGN PATENT DOCUMENTS

JP   2006-041088   2/2006

* cited by examiner

*Primary Examiner* — Sylvia R. MacArthur
(74) *Attorney, Agent, or Firm* — Martine Penilla Group, LLP

(57) ABSTRACT

An apparatus to supply a plurality of process fluids for processing a substrate in a semiconductor processing chamber is disclosed. The apparatus includes a plurality of process fluid supply valves and a fluid supply network that is defined between a crossover valve and a tuning supply valve. The apparatus further includes a tuning fluid supply being connected to the fluid supply network through the tuning supply valve. Further included with the apparatus is a plurality of process fluids that are connected to the fluid supply network through the plurality of process fluid supply valves. A process chamber that has a substrate support is also included in the apparatus. The process chamber further including an edge fluid supply and a center fluid supply, the edge fluid supply connected to the fluid supply network through an edge enable valve and the center supply connected to the fluid supply network through a center enable valve. Wherein the crossover valve, edge enable valve, and center enable valve allow one of tuning fluid or process fluids to flow to one of the edge fluid supply or the center fluid supply.

11 Claims, 12 Drawing Sheets

APPARATUS AND METHODS FOR ENHANCED FLUID DELIVERY ON BEVEL ETCH APPLICATIONS

BACKGROUND

Cleaning operations are becoming more critical during the manufacture of semiconductor wafers. Due to the changing nature of the manufacturing operations and the continuing desire to further reduce feature sizes timely removal of particulate material from semiconductor substrate is critical. Commensurate with the continued desire for reduced feature size is the desire to have process equipment that can provide flexibility in order to maximize equipment utilization and minimize downtime for reconfiguration. Having process equipment that is reconfigurable to perform multiple process operations can reduce the number of tools required, thereby potentially decreasing manufacturing and maintenance costs. In addition, as feature size continues to decrease, semiconductor substrates are increasingly sensitive to contamination.

Accordingly, there is a need to provide a robust fluid delivery system that is capable of providing process flexibility for enhanced process performance while minimizing potential sources of contamination.

SUMMARY

In one embodiment, an apparatus to supply a plurality of process fluids for processing a substrate in a semiconductor processing chamber is disclosed. The apparatus includes a plurality of process fluid supply valves and a fluid supply network that is defined between a crossover valve and a tuning supply valve. The apparatus further includes a tuning fluid supply being connected to the fluid supply network through the tuning supply valve. Further included with the apparatus is a plurality of process fluids that are connected to the fluid supply network through the plurality of process fluid supply valves. A process chamber that has a substrate support is also included in the apparatus. The process chamber further including an edge fluid supply and a center fluid supply. The edge fluid supply is connected to the fluid supply network through an edge enable valve and the center supply is connected to the fluid supply network through a center enable valve. The crossover valve, edge enable valve, and center enable valve allow one of tuning fluid or process fluids to flow to one of the edge fluid supply or the center fluid supply.

In another embodiment, a method to provide flexible application of a tuning fluid and a process fluid to a substrate is disclosed. The method includes operations that enable flow of the tuning fluid to a center supply through a first supply network. The first supply network is coupled to a cross-flow network that includes a closed crossflow valve. In another operation process fluid flow is enabled to the edge supply through a second supply network, where the second supply network is coupled to the cross-flow network. In still another operation flow of the tuning fluid and the process fluid is disabled. In another operation the first supply network, the second supply network, the cross-flow network, the center supply and the edge supply are purged through a purge network that is connected between the cross-flow network and the center supply and edge supply. In another operation flow of the process fluid is enabled, wherein a open cross-flow valve routes the process fluid to the center supply.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

An invention is disclosed for providing flexible configuration for semiconductor processing equipment. The ability to rapidly reconfigure a processing chamber provides manufacturers with flexibility regarding they type of processes that can be performed. This can lead to faster production times and decreased tool downtime for reconfiguration. In one embodiment, a supply network is disclosed that enables edge etching process fluids to be routed and dispensed near the center of a substrate. Alternatively, in one embodiment tuning fluids normally distributed near the center of the substrate may be routed to and dispensed near the edge of the substrate. In still another embodiments, the process fluids can be routed toward the center of the substrate, or the process fluids can be routed to both the center of the substrate and the edge of the substrate. The particular examples discussed above are intended to be exemplary and should not be construed as limiting as various combinations of these embodiments may be utilized.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
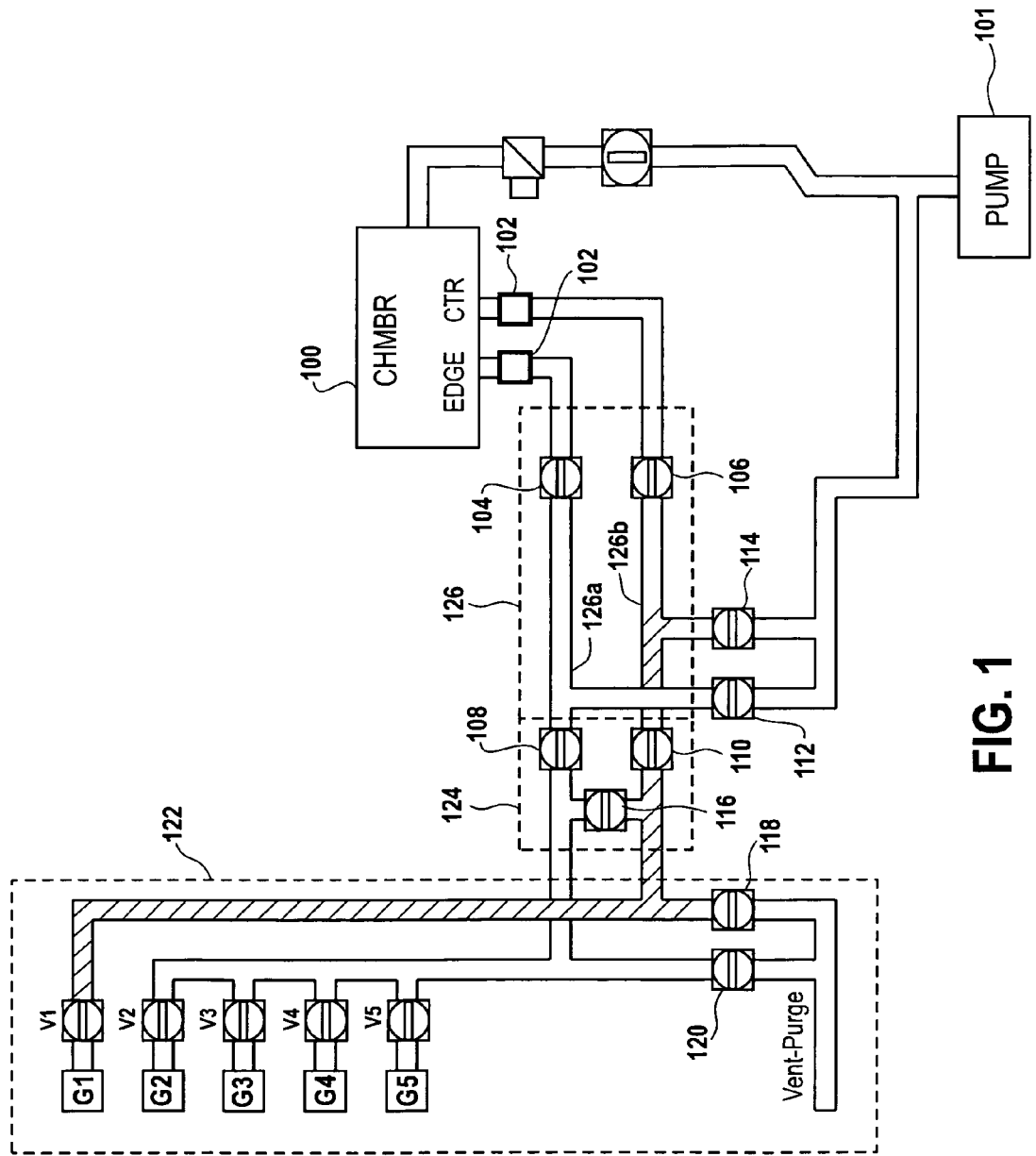
FIG. 1 shows a simplified exemplary schematic of a fluid supply system for a processing chamber for use in semiconductor fabrication, in accordance with one embodiment of the present invention.

FIG. 1 illustrates a simplified exemplary schematic of a fluid supply system for a processing chamber 100 for use in semiconductor fabrication, in accordance with one embodiment of the present invention. The processing chamber 100 is configured with a chamber supply network 126 that includes an edge supply 126a and a center supply 126b. Coupled to the chamber supply network 126 is a crossover network 124. Within the crossover network 124, there is a crossflow valve 116, an edge enable valve 108 and a center enable valve 110. The edge enable valve 108 and the center enable valve 110 are optional for this embodiment and should be considered exemplary. Other embodiments may include additional valves within the crossover network 124.

Coupled to the crossover network 124 is a source network 122. In the embodiment illustrated in FIG. 1, the source network 122 includes five fluid sources G1-G5 although more or fewer fluid sources may be used. In one embodiment G1 is a tuning fluid such as nitrogen. In other embodiments G1 can be another fluid such as any suitable inert gas or even a mixture of inert gases, such as argon, helium, neon, xenon, etc. (The other four fluid sources G2-G5 are process fluids that can be combined in various ratios depending on the processing being performed within the chamber 100. For the embodiment shown in FIG. 1, fluid sources G2-G5 can include processing fluids for use in an etching process such as, but not limited to, oxygen ($O_2$), carbon dioxide ($CO_2$), tetrafluoromethane ($CF_4$), sulfur tetrafluoride ($SF_4$) and $SF_6$, etc., or mixtures thereof.

The individual fluids G1-G5 can be dispensed individually through respective valves V1-V5. In one embodiment, where the chamber 100 is configured primarily to perform an edge etch of a semiconductor substrate, the tuning fluid is connected to the center supply 126b through the crossover network 124. Likewise, the fluid sources G2-G5 are connected to the edge supply 126a. However, the crossover network 124 allows the chamber to change configurations, thereby allowing process fluids G2-G5 to be sent to the center supply 126b. Alternatively, the crossover network 124 can further allow the tuning fluid to be routed to the edge supply 126a.

Coupled to both the source network 122 and the chamber supply network 126 are purge valves 112, 114, 118 and 120. The purge valves, in conjunction with additional valves throughout the source network 122, crossover network 124 and chamber supply network 126 enable fluids within the source network 122, crossover network 124 and chamber supply network 126 to be purged before changing valve positions within the crossover network 122. Purging and clearing the respective networks before utilizing the crossover network 122 can prevent unwanted reactions that could lead to particle generation within the respective networks. In other embodiments, where the process fluids and tuning fluids are non-reactive with each other, the purging valves may be omitted in order to simplify fabrication and reduce fabrication costs. As illustrated in FIG. 1, pump 101 is in fluid communication with valves 112 and 114. In addition pump 101 is in fluid communication with chamber 100 through valve 103 for purging the chamber. It should be appreciated that the box above valve 103 represents a throttle control valve that opens and closes to maintain a certain chamber pressure. i.e., the throttle control valve does not seal.

Regardless of whether a purging system is used, the crossover network 124 allows fluid that was sent to the edge supply 126a to be sent to the center supply 126b. One advantage of including the purge valves is the potential to reduce fluid transition times and improved control over pressure transients during fluid switching processing. The purge valves allow fluids within the supplies to be quickly evacuated before switching the crossover valve. Thus, the purge valves can allow for faster transitions times when altering the flow of fluids to the process chamber.

In some embodiments, a separate purge fluid can be used to clear the respective supplies. The ability to have a separate purge fluid from the tuning fluid allows enhanced process control while reducing potential contamination issues by means of introducing alternative chemistries to the center or the edge supplies.

The ability to easily change the configuration of the fluid supplies can provide flexibility during the processing of semiconductor substrates. For example, the ability to split the flow such that the tuning fluid is delivered to the center supply 126b and the process fluid is delivered to the edge supply 126a, allows for increased process performance and a reduction in potential contamination issues. Furthermore, the ability to change the configuration of the fluid supplies can reduce the total number of processing chambers required to process a semiconductor substrate. Additionally, the ability to route all fluids to the edge supply 126a or the center supply 126b provides flexibility in developing new processes with enhanced process performance and reduced contamination issues.

Figure 2:
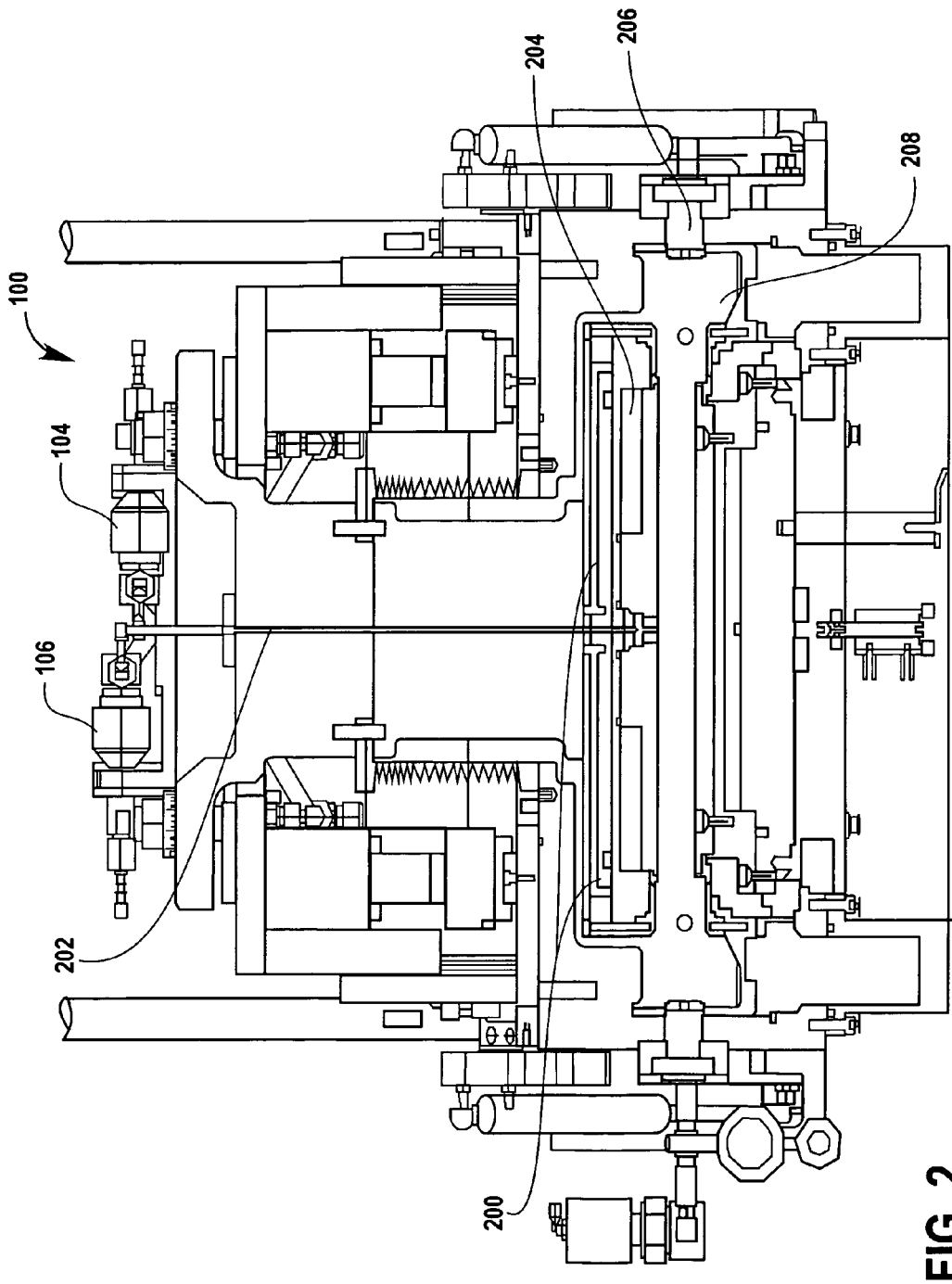
FIG. 2 is an exemplary cross-section view of a chamber, in accordance with one embodiment of the present invention.

FIG. 2 is an exemplary cross-section view of a chamber 100, in accordance with one embodiment of the present invention. The cross-section illustrates both a center feed 202 and an edge feed 200 within the chamber 100. The edge feed 200 is connected to the edge supply from FIG. 1. Likewise, the center feed 202 is connected to the center supply from FIG. 1. Thus, fluids routed to the edge supply of FIG. 1 are distributed within the chamber 100 by the edge feed 200. Similarly, fluids routed to the center supply of FIG. 1 are distributed within the chamber 100 by the center feed 202.

Within the chamber 100, a plate 204 and a top plate 206 are visible. Additionally, the chamber liner 208 is visible. In the embodiment illustrated the center feed 202 and the edge feed 200 enter through the top of the chamber 100. Visible on top of the chamber 100 are center isolation valve 106 and edge isolation valve 104. As illustrated, the center feed 202 obstructs the view the edge feed 200. In the embodiment shown, the edge feed 200 is located behind the center feed 202.

Furthermore, the edge feed 200 includes a manifold that distributes the edge feed 200 to a plurality of branches that extend radially toward the edge of a substrate. This allows the edge feed 200 to distribute fluid to multiple points around the edge of a substrate within the chamber. In one embodiment, fluid supplied to the center feed is dispensed through a plurality of ports in order to promote even distribution of the fluid around the center of the substrate.

Figure 3:
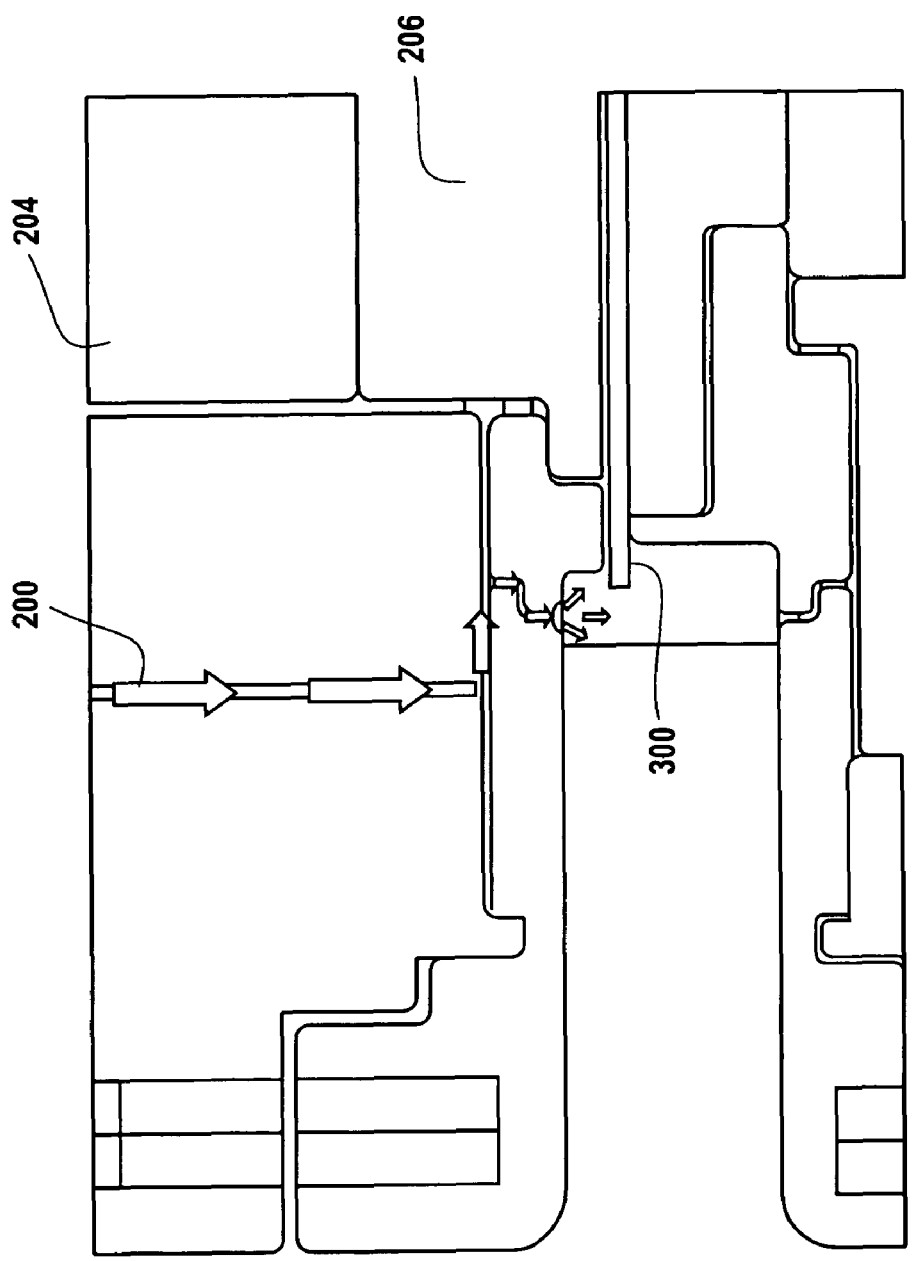
FIG. 3 is an exemplary illustration of a close up of a cross-section of an edge feed within the chamber in accordance with one embodiment of the present invention.

FIG. 3 is an exemplary illustration of a close up of a cross-section of an edge feed 200 within the chamber 100 in accordance with one embodiment of the present invention. The chamber 100 is shown in a closed position with a bottom surface of the top plate 206 proximate to a top surface of substrate 300. Also visible is the cross-section of an edge feed 200. The edge feed 200 allows fluid supplied to the edge supply to flow toward the edge of the substrate 300. Recall that similar edge feeds are distributed around the perimeter of the substrate 300. Such a configuration allows process fluids or a tuning fluid to be distributed evenly around the substrate.

In one embodiment, process fluids for an etch operation are directed to the edge feed 200. When the edge of the substrate is exposed to the process fluids, material that may have been built up on the edge from previous processing operations can be removed through an etch operation. In other embodiments, the processing chamber may be reconfigured so the edge feed 200 supplies a tuning fluid to the edge of a substrate.

Figure 4:
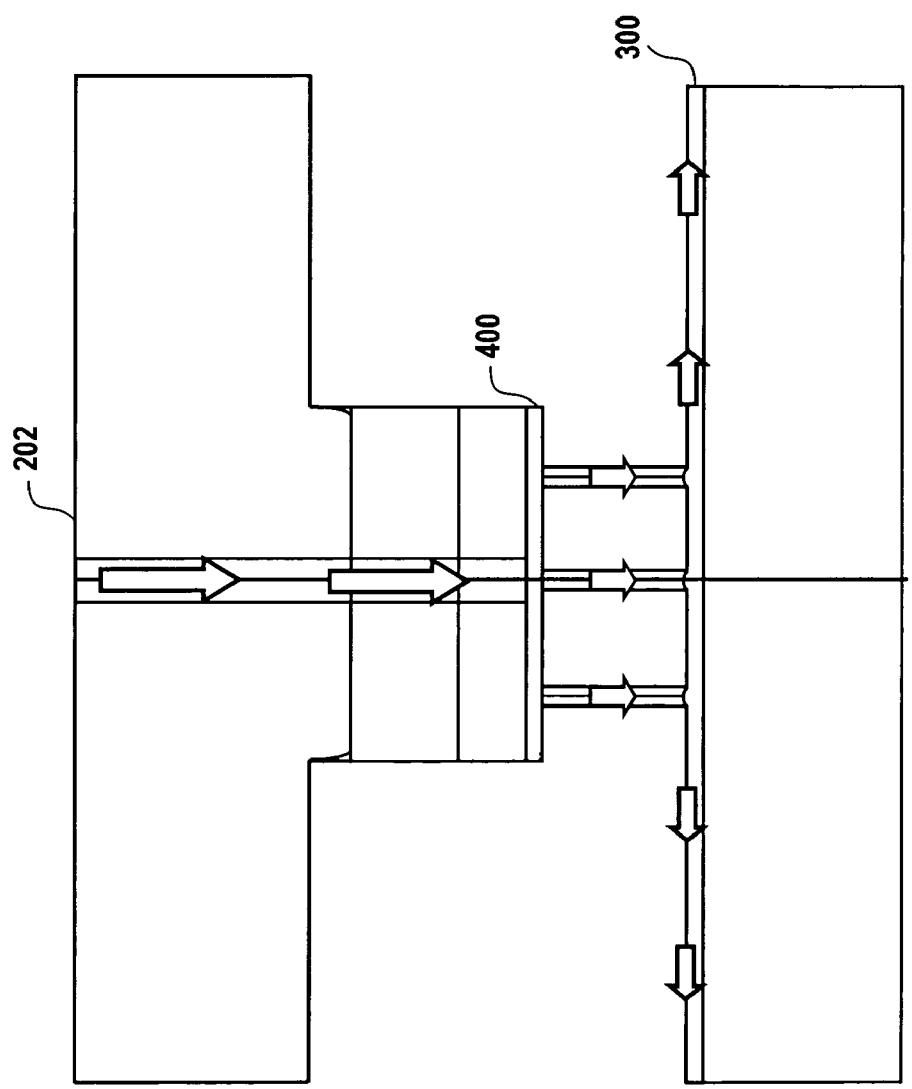
FIG. 4 is an exemplary illustration of a cross-section of a center feed within the chamber, in accordance with one embodiment of the present invention.

FIG. 4 is an exemplary illustration of a cross-section of a center feed 202 within the chamber 100, in accordance with one embodiment of the present invention. Fluids are supplied to the center feed 202 through the center supply. In the embodiment illustrated, a manifold within the chamber distributes the fluid from the center feed 202 over the center of the substrate 300. The number of distribution ports from the manifold should not be considered limiting and other embodiments can have fewer or more distribution ports coupled to the center feed 202.

Figure 5:
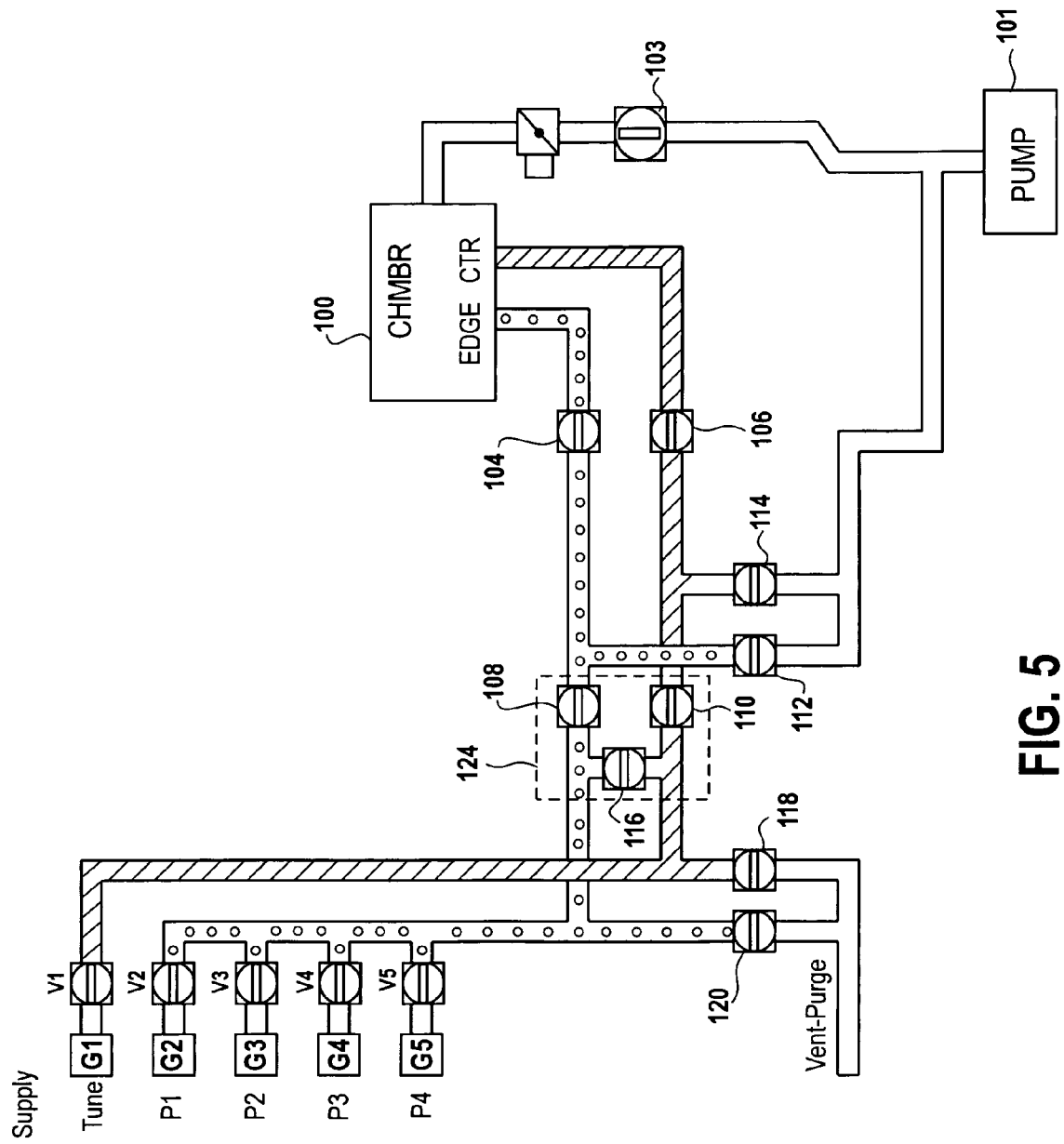
FIG. 5 is an exemplary illustration of valve positions for routing the tuning fluid to the center of the substrate and the process fluids to the edge of the substrate, in accordance with one embodiment of the present invention.

FIG. 5 is an exemplary illustration of valve positions for routing the tuning fluid to the center of the substrate and the process fluids to the edge of the substrate, in accordance with one embodiment of the present invention. In this embodiment flow of the tuning fluid is illustrated with a diagonal fill pattern. The tuning fluid is shown flowing through V1 from the supply G1. Similarly, fluid from supplies G2, G3, G4 and G5 flow through their respective valves V2, V3, V4 and V5. In this embodiment, purge valves 118 and 120 are closed to promote flow of the tuning fluid and process fluid to the crossover network 124.

With crossover valve 116 being closed and the edge enable valve 110 being open, the tuning fluid enters into the chamber supply 126. Likewise, the edge enable valve 108 is open and the process fluid enters into the chamber supply 126. Both the edge pumpout valve 112 and the center pumpout valve 114 are shown as closed in order to enable fluid flow to the chamber. Lastly, edge isolation valve 104 and center isolation valve 106 are in an open position to allow fluid to flow into the chamber. It should be appreciated that if valve V1 is closed then process fluids are supplied to the edge and the tuning fluid is not delivered to the center region of chamber 100.

Figure 6A:
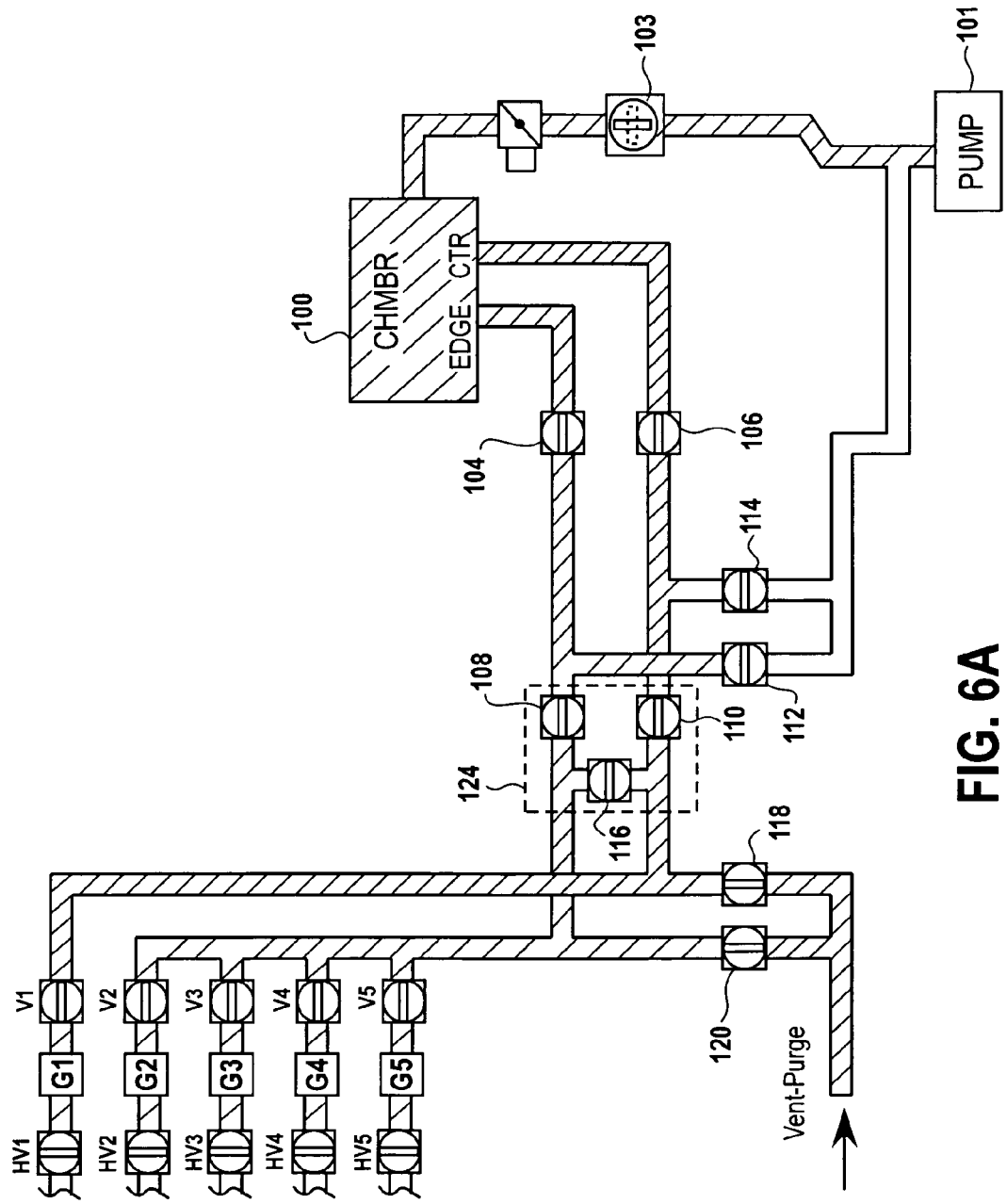
FIG. 6A is an exemplary illustration of valve positions for purging the input supply network, the crossover supply network and the chamber supply network, in accordance with one embodiment of the present invention.

FIG. 6A is an exemplary illustration of valve positions for purging the input supply network, the crossover supply network and the chamber supply network, in accordance with one embodiment of the present invention. Purging the entire fluid supply network can be performed to evacuate any residual process fluid or tuning fluid and in the instance where all the mass flow controllers are to be changed. As illustrated, the edge pumpout valve 112, the center pumpout valve 114, the center purge valve 118 and the edge purge valve 120 are open. Conversely, the edge enable valve 108, the center enable valve 110, and the crossover valve 116 are shown as closed. This allows the center purge valve 118 and the edge purge valve 120 to evacuate any remaining fluid from the combined input supply network and the crossover supply network.

Similarly, the open edge pumpout 112 and center pumpout 114 along with the open edge isolation valve 104 and center isolation valve 106 allow fluid within the chamber supply 126 to be evacuated. In another embodiment, the edge isolation valve 104 and the center isolation valve 106 are closed when the edge pumpout valve 112 and center pumpout valve 114 are open. This can assist in preventing and particulate or particulates trapped within the filters 102 from becoming dislodged and being pulled into the respective chamber supply lines. In an alternative embodiment, the edge enable valve 108 and center enable can be left open thereby allowing both the purge valves 118 and 120 to function in conjunction with the pumpout valves 112 and 114. The embodiment illustrated in FIG. 6A should be construed as exemplary. Other embodiments may include additional valves to enable or disable fluid flow. For example, hand valves (HV) 1-5 are provided to isolate the process fluid supplies G1-G5 in this embodiment. Furthermore, additional valve, pumps, recycling lines and supply lines may be necessary to effectuate proper flow within the system. For the sake of simplicity, such items have been omitted from the drawings.

Figure 6B:
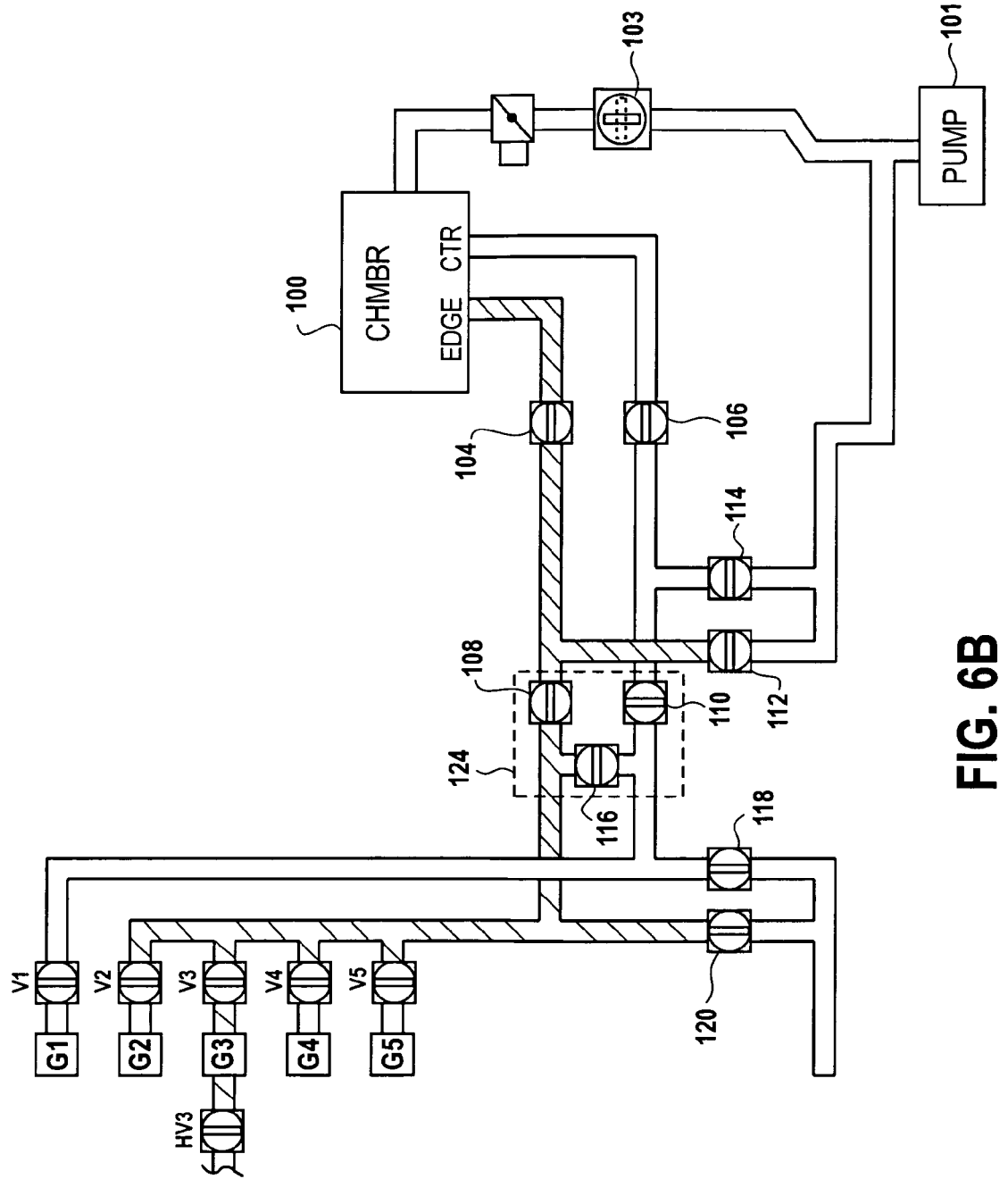
FIG. 6B illustrates an embodiment for the purge of a single process gas in accordance with one embodiment of the invention.

FIG. 6B illustrates an embodiment for the purge of a single process gas in accordance with one embodiment of the invention. In this embodiment, valve 120 is open, as well as valves V3 108, and 104 to enable the purging of G3 and the corresponding line. It should be appreciated that valve 120 is open and valve 103 is closed for the purge process and when the pumpout of chamber 100 occurs valve 120 closes and valve 103 opens. One skilled in the art will appreciate that this embodiment may be employed for changing a single mass flow controller along the corresponding line.

Figure 6C:
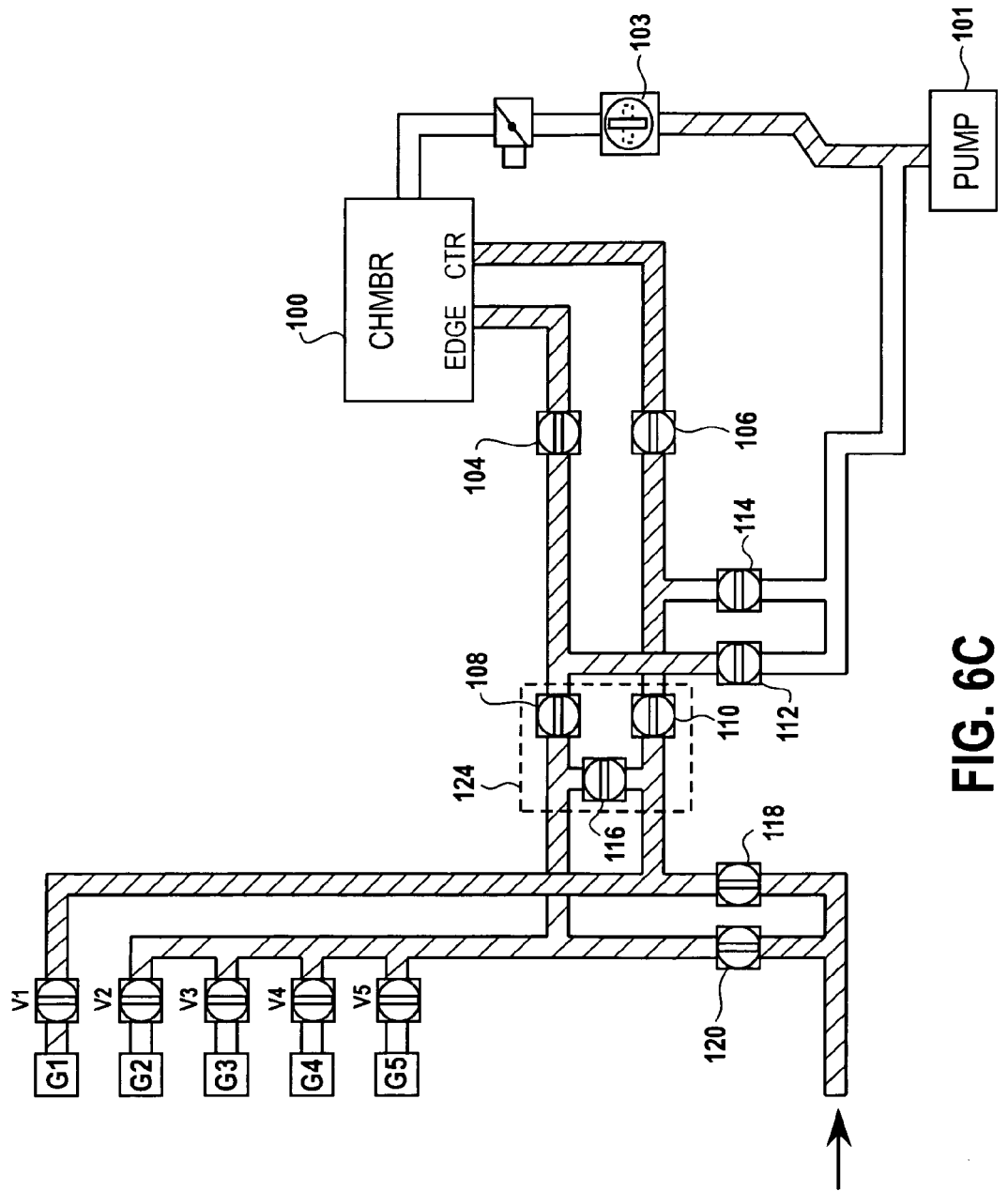
FIG. 6C illustrates an embodiment for the valve positions for the purging of the supply and tuning lines in accordance with one embodiment of the invention.
Figure 6D:
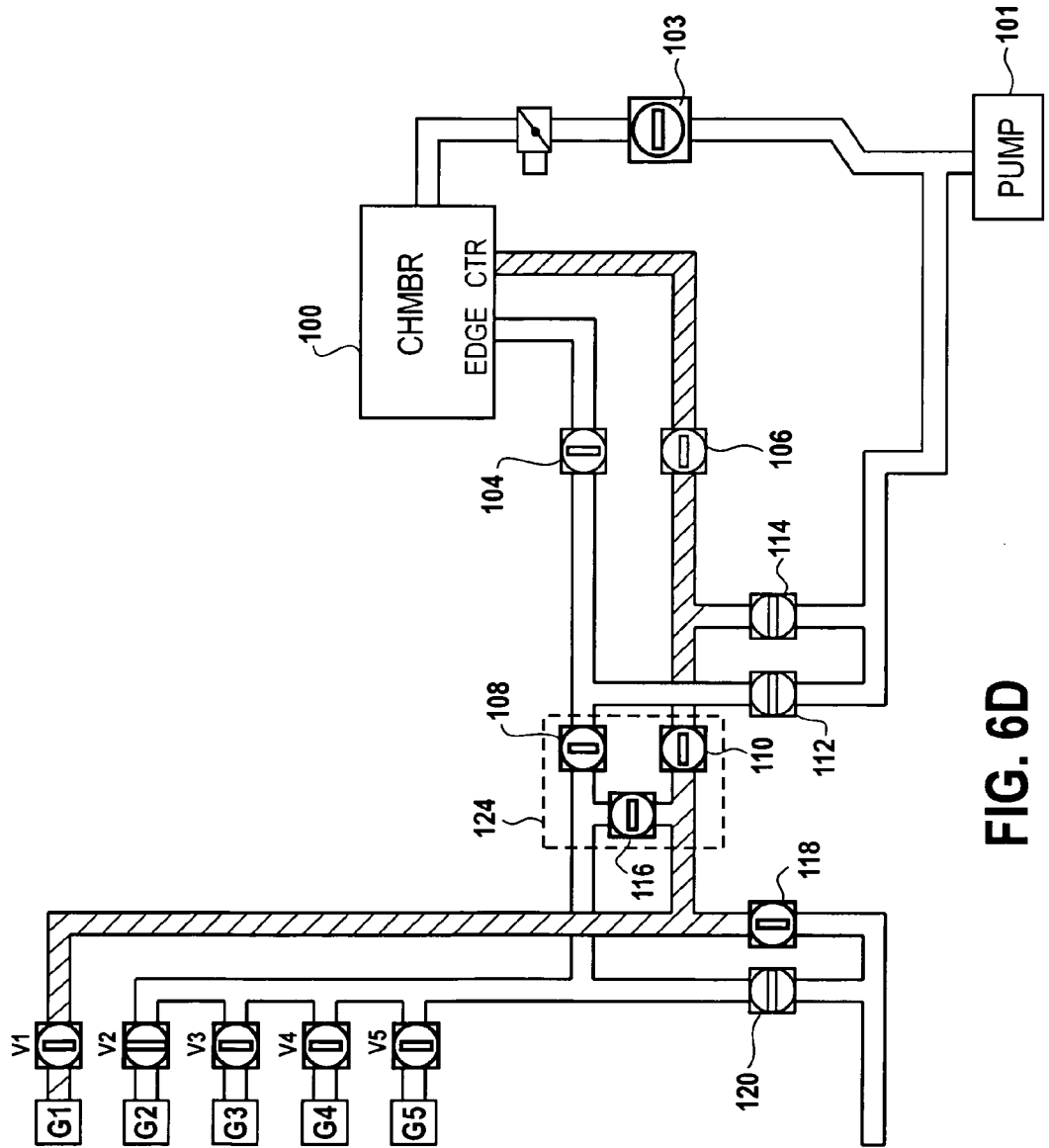
FIG. 6D is a simplified schematic diagram illustrating the valve positions for a chamber vent process in accordance with one embodiment of the invention.

FIG. 6C illustrates an embodiment for the valve positions for the purging of the supply and tuning lines in accordance with one embodiment of the invention. In this embodiment, valves 118 and 120 are open for the purge process, while valve 103 is closed. For the pump out process valve 103 is open while valves 118 and 120 are closed. FIG. 6D is a simplified schematic diagram illustrating the valve positions for a chamber vent process in accordance with one embodiment of the invention. Valves 118, 110 and 106 are initially open to purge and in one embodiment, when the chamber pressure reaches a certain pressure valves 118, 110 and 106 close. In one exemplary embodiment, when the chamber pressure is greater than or equal to one atmosphere, valves 118, 110, and 106 close.

Figure 7A:
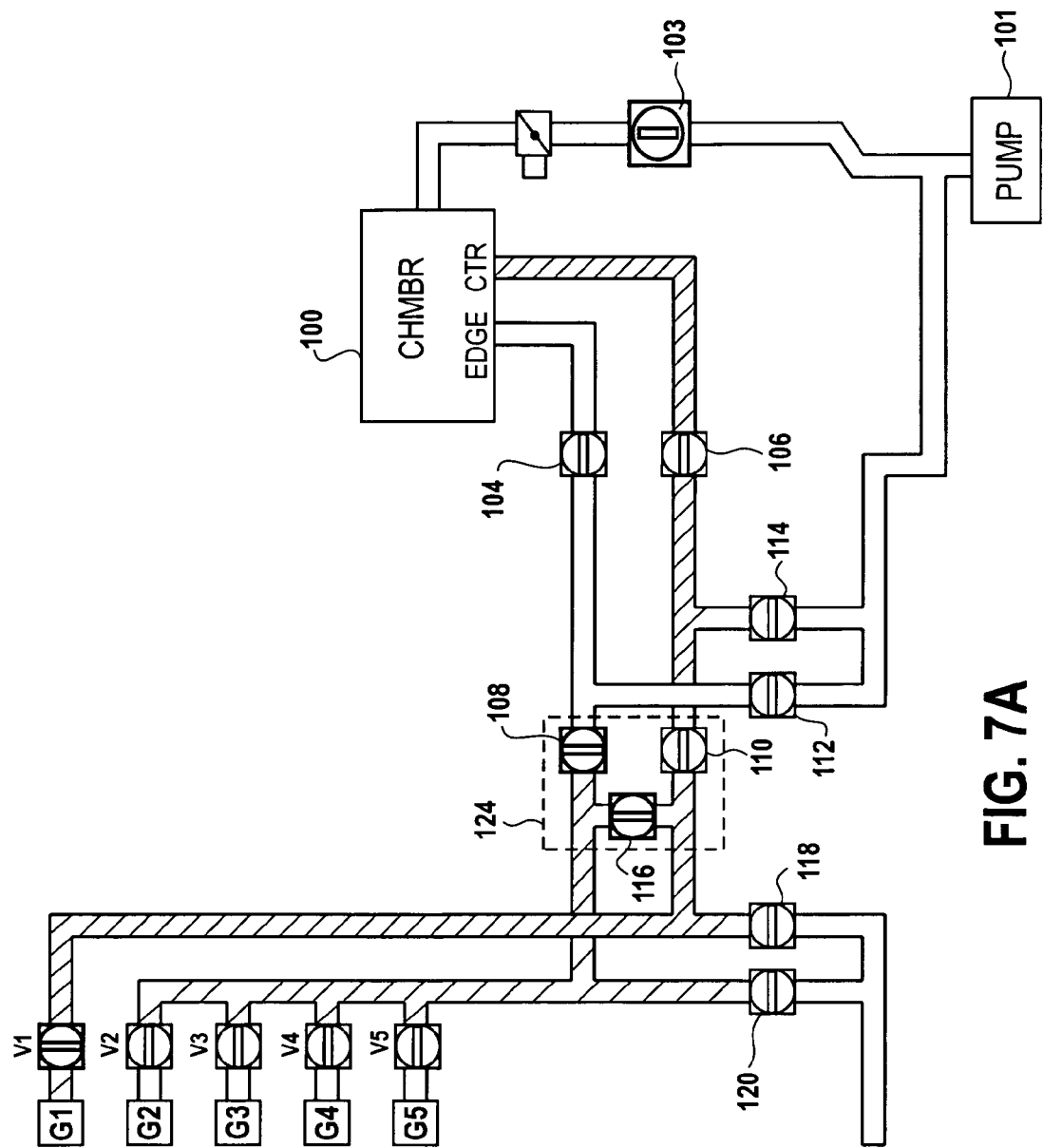
FIG. 7A is an exemplary illustration of valve positions for routing the process fluid to the center of the substrate, in accordance with one embodiment of the present invention.

FIG. 7A is an exemplary illustration of valve positions for routing the process fluid to the center of the substrate, in accordance with one embodiment of the present invention. In this embodiment, the process fluid is shown with a diagonal hatch pattern flowing to both the center of the substrate. The process fluid is supplied through fluid supplies G2, G3, G4 and G4. Opening the crossover valve 116 allows the process fluid to crossover from the edge supply 126a to the center supply 126b. As illustrated, the center enable valve 110 is in the open position. It should be appreciated that if V1 is open then tuning and process fluid is delivered to the center region.

Figure 7B:
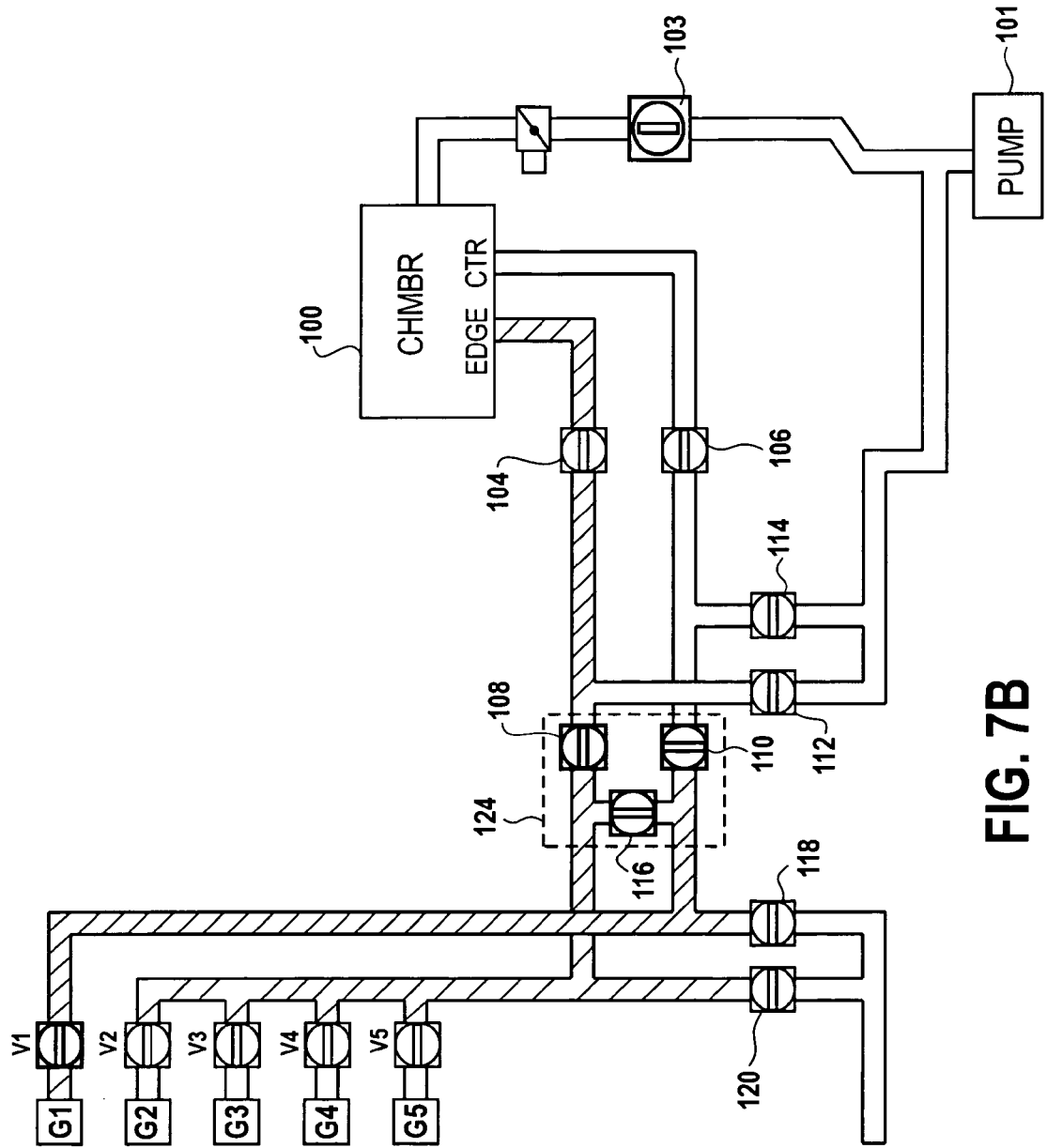
FIG. 7B illustrates the valve positions for delivering tuning and process fluids to an edge of the edge region of a substrate disposed in the chamber.

FIG. 7B illustrates the valve positions for delivering tuning and process fluids to an edge of the edge region of a substrate disposed in chamber 100. In this embodiment, valves 104, 108 and 116 are open to enable the tuning and process fluids access to the edge region.

Figure 8:
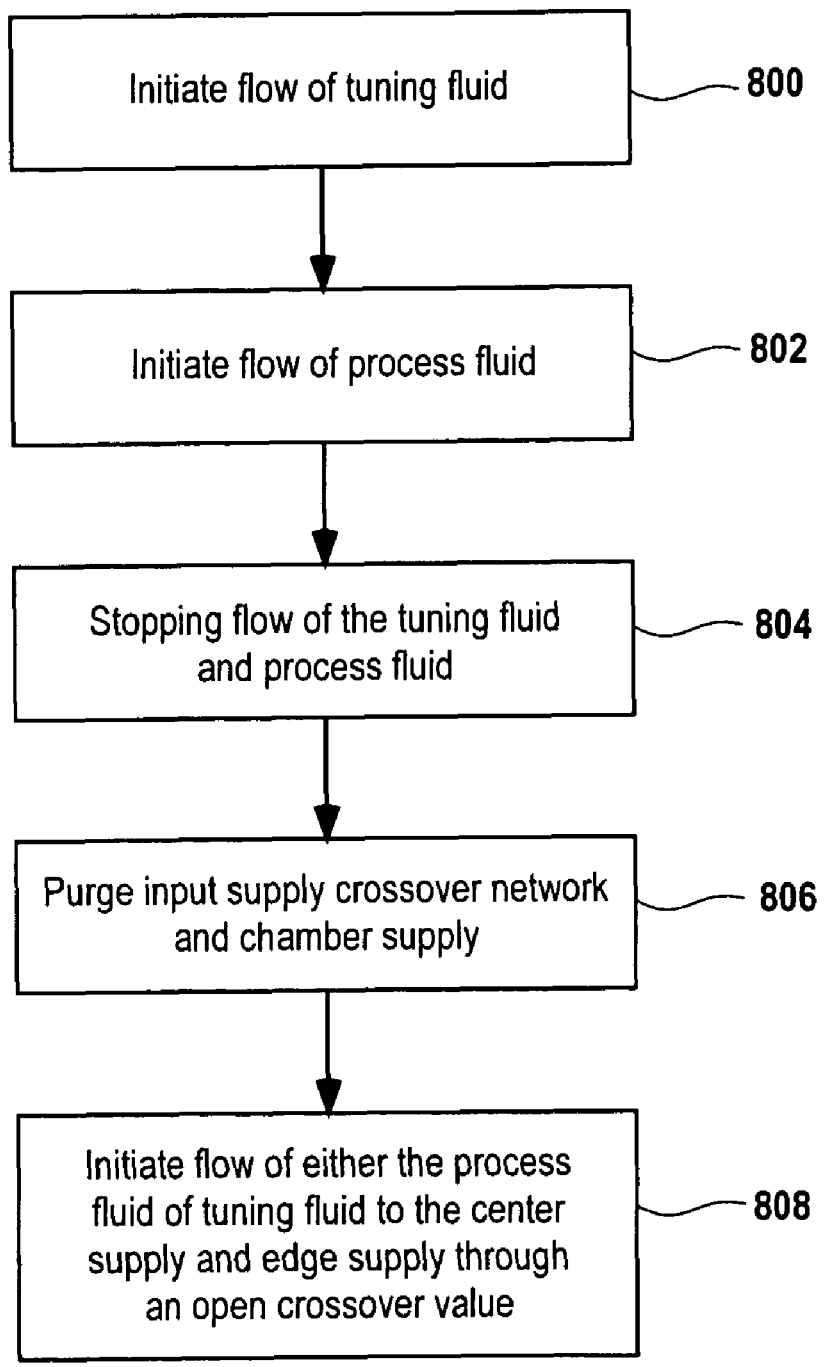
FIG. 8 is flow chart with exemplary illustrations for modifying the flow of a tuning fluid and process fluids in accordance with one embodiment of the present invention.

FIG. 8 is an exemplary flow chart illustrating procedural operations to modify the flow of process fluids in accordance with one embodiment of the present invention. The procedure is initiated by operation 800, where flow of a tuning fluid to a process chamber is initiated. The tuning fluid flows through an input supply, a crossover network, and a chamber supply before being dispensed within the process chamber. Operation 802 initiates fluid flow of process fluids to the process chamber. The process fluids are supplied to the process chamber through an input supply, the crossover network, and the chamber supply.

In one embodiment, the chamber supply includes an edge supply and a center supply that are both connected to the crossover network. Similarly, the input supply may include a plurality of supplies. For example, in one embodiment, the input supply has a first supply for the tuning fluid and a second supply for the process fluid. In this embodiment, each of the respective supplies for the tuning fluid and process fluids are connected to the crossover network.

With operation 804, flow of both the tuning fluid and the process fluid is stopped. Operation 806 purges the input supply, the crossover network and the chamber supply. Operation 808 flows one of either the process fluid or the tuning fluid to both the center supply and the edge supply through an open crossover valve within the crossover network. The description of the preceding operations should be viewed as one embodiment and should not be construed as limiting. For example, in another embodiment, operation 800 can flow process fluid rather than tuning fluid. Similarly, operation 802 can flow tuning fluid rather than process fluid. Additionally, in other embodiments, the purge operation can include flowing of non-reactive fluids within the input supplies, the crossover network and the chamber supply. Such an operation can be used to minimize potential contamination from residual process or tuning fluid within a supply.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus to supply a plurality of process fluids for processing a substrate in a semiconductor processing chamber, comprising:
   a fluid supply network being defined between a crossover valve and a tuning supply valve and a plurality of process fluid supply valves;
   a tuning fluid supply being connected to the fluid supply network through the tuning supply valve;
   a plurality of process fluids being connected to the fluid supply network through the plurality of process fluid supply valves;
   a process chamber having a substrate support, the process chamber further having an edge fluid supply and a center fluid supply, the edge fluid supply connected to the fluid supply network through an edge enable valve and the center supply connected to the fluid supply network through a center enable valve, wherein the crossover valve, edge enable valve, and center enable valve allow one of tuning fluid or process fluids to flow to one of the edge fluid supply or the center fluid supply; and
   a pumpout pump connected to the edge supply and the center supply through a respective edge pump valve and a center pump valve, wherein the pumpout pump evacuates fluid within the fluid supply network.

2. An apparatus to supply a plurality of process fluids for processing a substrate in a semiconductor processing chamber, comprising:
   a fluid supply network being defined between a crossover valve and a tuning supply valve and a plurality of process fluid supply valves;
   a tuning fluid supply being connected to the fluid supply network through the tuning supply valve;
   a plurality of process fluids being connected to the fluid supply network through the plurality of process fluid supply valves;
   a process chamber having a substrate support, the process chamber further having an edge fluid supply and a center fluid supply, the edge fluid supply connected to the fluid supply network through an edge enable valve and the center supply connected to the fluid supply network through a center enable valve, wherein the crossover valve, edge enable valve, and center enable valve allow one of tuning fluid or process fluids to flow to one of the edge fluid supply or the center fluid supply; and
   a purge pump connected to the fluid supply network through respective edge purge valve and center purge valve, wherein the purge pump evacuates fluid within the fluid supply network.

3. An apparatus as described in claim 1, wherein when the crossover valve is closed the tuning fluid is directed to the center supply and the process fluid is directed to the edge fluid supply.

4. A supply network to control fluid flow to a process chamber, comprising:
   a tuning fluid supply being coupled to an input supply network through a tuning supply valve;
   a process fluid supply being coupled to the input supply network through a process supply valve; and
   a crossover network having a crossover valve, the crossover network coupled between the input supply network and a process chamber having an edge supply and a center supply, the edge supply coupled to the crossover network through an edge supply valve and the center supply coupled to the crossover network through a center fluid supply valve;
   wherein the crossover valve defines whether the tuning fluid or the process fluid is supplied to one of the edge supply or the center supply;
   wherein when the crossover valve is closed the tuning fluid is directed to the center supply and the process fluid is directed to the edge supply.

5. A supply network as described in claim 4, wherein the process fluid supply is defined to support a plurality of process fluids.

6. A supply network as described in claim 4, wherein the tuning fluid supply includes a filter being positioned proximate to the process chamber.

7. A supply network as described in claim 4, wherein the process fluid supply includes a filter being positioned proximate to the process chamber.

8. A supply network to control fluid flow to a process chamber, comprising:
   a tuning fluid supply being coupled to an input supply network through a tuning supply valve;
   a process fluid supply being coupled to the input supply network through a process supply valve;
   a crossover network having a crossover valve, the crossover network coupled between the input supply network and a process chamber having an edge supply and a center supply, the edge supply coupled to the crossover network through an edge supply valve and the center supply coupled to the crossover network through a center fluid supply valve, wherein the crossover valve defines whether the tuning fluid or the process fluid is supplied to one of the edge supply or the center supply; and
   an input purge system being defined between the input supply network and the crossover network.

9. A supply network as described in claim 8, wherein the input purge system is defined to purge one or both of the tuning fluid and the process fluid.

10. A supply network to control fluid flow to a process chamber, comprising:
    a tuning fluid supply being coupled to an input supply network through a tuning supply valve;
    a process fluid supply being coupled to the input supply network through a process supply valve;

a crossover network having a crossover valve, the crossover network coupled between the input supply network and a process chamber having an edge supply and a center supply, the edge supply coupled to the crossover network through an edge supply valve and the center supply coupled to the crossover network through a center fluid supply valve, wherein the crossover valve defines whether the tuning fluid or the process fluid is supplied to one of the edge supply or the center supply; and a supply purge being defined between the crossover network and the process chamber.

11. A supply network as described in claim 10, wherein the supply purge is defined to purge one or both of the tuning fluid and the process fluid.

\* \* \* \* \*